United States Patent [19]
Boe

[11] Patent Number: 6,018,867
[45] Date of Patent: Feb. 1, 2000

[54] INTEGRATED CIRCUIT CARTRIDGE EXTRACTING TOOL

[75] Inventor: Craig L. Boe, Nampa, Id.

[73] Assignee: Micron Electronics, Inc., Nampa, Id.

[21] Appl. No.: 08/946,109

[22] Filed: Oct. 2, 1997

[51] Int. Cl.[7] .............................. B23P 19/00; B23P 19/04
[52] U.S. Cl. ............................. 29/762; 29/764; 29/258; 29/260; 29/266
[58] Field of Search ........................... 29/764, 762, 758, 29/258, 260, 266, 267, 278

[56] References Cited

U.S. PATENT DOCUMENTS

| | | | |
|---|---|---|---|
| 3,110,960 | 11/1963 | Rondash | 29/278 |
| 3,626,575 | 12/1971 | Greenspan | 29/764 |
| 3,859,706 | 1/1975 | Williams et al. | 29/762 |
| 3,952,394 | 4/1976 | Seminario | 29/263 |
| 4,215,468 | 8/1980 | Greco | 29/278 |
| 4,660,281 | 4/1987 | Omand . | |
| 4,858,309 | 8/1989 | Korsunsky et al. | 29/278 |
| 5,046,237 | 9/1991 | Conforti et al. . | |
| 5,062,201 | 11/1991 | Long, Jr. . | |
| 5,152,052 | 10/1992 | Rantala et al. | 29/764 |
| 5,193,269 | 3/1993 | Dattilo | 29/764 |
| 5,203,074 | 4/1993 | Lam . | |
| 5,253,408 | 10/1993 | Wright | 29/280 |
| 5,265,328 | 11/1993 | Gorman | 29/762 |
| 5,287,617 | 2/1994 | Murphy . | |
| 5,425,169 | 6/1995 | Steinman et al. | 29/758 |
| 5,440,803 | 8/1995 | Selgas, Jr. et al. . | |
| 5,502,887 | 4/1996 | Gonzales . | |
| 5,617,628 | 4/1997 | Harder et al. . | |

OTHER PUBLICATIONS

Yevchak et al, Extraction and Insertion Tool for Printed Circuit Cards, IBM Techical Bulletin, vol. 2, No. 3, p. 38, Oct. 1959.

*Primary Examiner*—Lee Young
*Assistant Examiner*—A. Dexter Tugbang
*Attorney, Agent, or Firm*—Knobbe, Martens, Olson & Bear, LLP

[57] ABSTRACT

An integrated circuit cartridge extracting tool includes a generally u-shaped frame including a crossbar and first and second legs extending from the crossbar. An upper bar is located adjacent to the crossbar. First and second rods are coupled to the upper bar and extend through the crossbar. Each rod has a dowel extending out from a lower portion thereof for engaging a device to be extracted, such as an integrated circuit cartridge. A cam lever is operatively in contact with the upper bar and the cross bar. The cam lever can be moved from a first position to a second position which causes the upper bar to move away from said crossbar.

9 Claims, 4 Drawing Sheets

INTEGRATED CIRCUIT CARTRIDGE EXTRACTING TOOL

BACKGROUND OF THE INVENTION

1. Field of the Invention

The invention relates generally to tools and methods for removing components from connectors. Embodiments of the invention relate to tools and methods for removing integrated circuits, daughter boards, and other electrical components from connectors or sockets on circuit boards and for removing printed circuit boards from back plane connectors.

2. Description of the Related Art

In the electronics industry, integrated circuits such as memory, microprocessors and signal processors are packaged in a variety of forms. These integrated circuit packages are typically connected to further circuitry by means of a socket or connector which is mounted on a printed circuit board and receives the integrated circuit package. One type of integrated circuit package is a microprocessor packaged in a cartridge form with electrical contacts formed along a side edge. Such an integrated circuit cartridge is used in conjunction with a connector configured to receive the cartridge. One such cartridge is presently being utilized by Intel Corporation for their Pentium® II processor. Such an integrated circuit cartridge and the associated connector are shown in FIG. 1, with the connector being shown separately in FIG. 2.

Referring specifically to FIG. 1, the cartridge, generally indicated at 400, includes a heat sink 402 which includes fins 403. The cartridge also includes side guide rails 404, 406 at opposite ends of the cartridge and electrical contacts along the bottom side edge of the cartridge (not shown). Each guide rail also includes a latch 408 which protrudes therefrom and a latch lever 412, 414 which, when pressed inward, retracts the associated latch into the rail 404, 406.

Referring now to FIG. 2, the connector 500 includes a first goal post 502 and a second goal post 504. The goal posts include respective openings 506 and 508 for receiving respective latches located on the cartridge 400. The goal posts 502, 504 are configured to receive the respective side guide rails 404, 406 and thereby function as guides. The goal posts 502, 504 are connected respectively, to bases 510, 512 from which the two goal posts extend in an upwardly direction. Extending between the bases 510, 512 is a socket 514 for receiving the edge of the cartridge having the electrical contacts. The socket 514 includes electrical contacts for forming connections with the respective electrical contacts of the cartridge.

To install such a cartridge in a connector mounted on a mother board, the cartridge 400 (FIG. 1), including electrical contacts on its bottom edge (not shown) oriented toward the motherboard, is aligned with the connector 500 (FIG. 2) using the side guide rails 404, 406 of the connector in cooperation with the goal posts 502, 504 as shown in FIG. 1. The cartridge slides along the goal posts until the latches engage with the openings 506, 508 to provide a secure physical and electrical connection between the connector and the cartridge. The electrical contacts on the side edge of the cartridge are in electrical contact with the corresponding electrical contacts of the socket (not shown) when the latches of the cartridge engage the openings 506, 508 in the goal posts.

Though integrated circuit cartridges and connectors provide good electrical and mechanical connections, it is sometimes necessary to remove a cartridge from its connector. Removal may be necessitated in order to replace the cartridge or as part of a testing, troubleshooting or maintenance procedure. Removing the cartridge has proven to be an awkward and difficult task. Typically, technicians remove the cartridge using their hands. This requires pressing both latch levers while pulling the cartridge away from the connector, which is very difficult to accomplish with only two hands. Frequently, technicians have resorted to rocking the cartridge from side to side to remove it from the connector. Unfortunately, this approach may result in damaged connectors and/or cartridges. Typically, the cartridges are expensive and it is important to avoid damaging them. In addition, if the connector itself is damaged, the entire board must often be reworked or discarded. The lack of an efficient and nondescructive way to remove the cartridges from the connectors leads to extra costs and wasted goods and/or the loss of production time.

SUMMARY OF THE INVENTION

The present invention addresses the above and other needs by providing an improved extraction tool which, in one embodiment, can be used for removing integrated circuit cartridges from connectors. An apparatus embodying the principles of the invention may include a generally u-shaped frame including a crossbar and first and second legs extending from the crossbar. An upper bar is located adjacent to the crossbar. First and second rods are coupled to the upper bar and extend through the crossbar. Each rod has a dowel extending out from a lower portion thereof for engaging a device to be extracted, such as an integrated circuit cartridge. A cam lever is operatively in contact with the upper bar and the cross bar. The cam lever can be moved from a first position to a second position which causes the upper bar to move away from said crossbar.

DETAILED DESCRIPTION OF THE PREFERRED EMBODIMENTS

The invention will be described in terms of exemplary embodiments adapted to extract integrated circuit cartridges from a connector. However, it will be clear to those skilled in the art that the principles of the invention can be utilized in other applications where it is desired to exert a pulling or extracting force. The exemplary embodiments are described below in further detail with reference to the Figures, wherein like elements are referenced by like numerals throughout.

Figure 3:
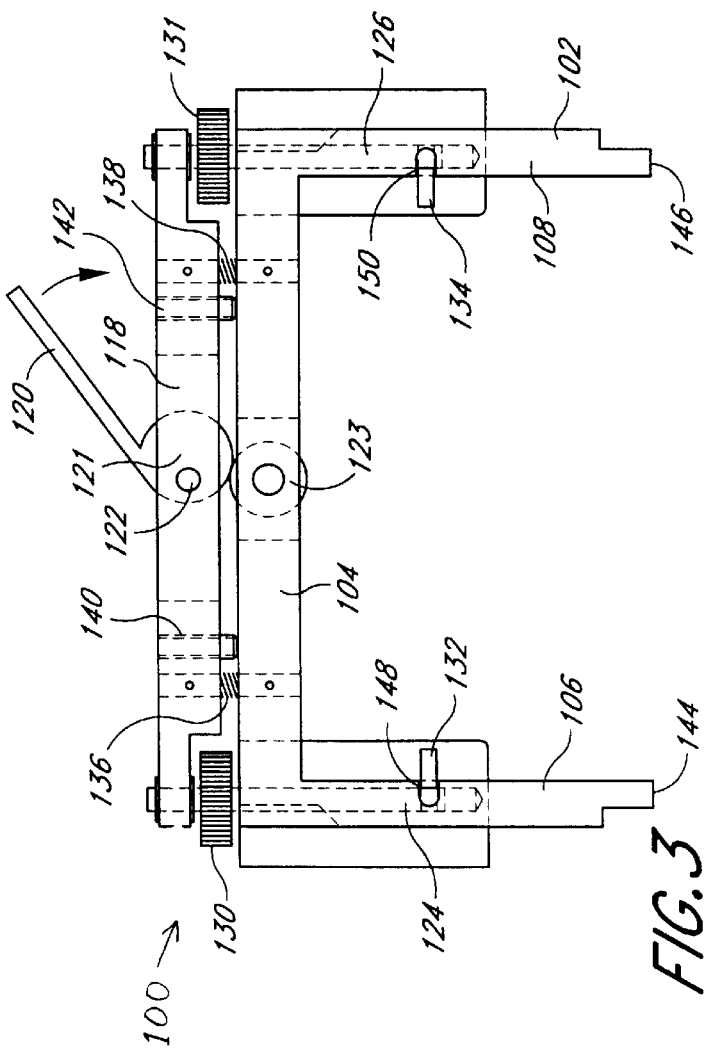
FIG. 3 is a front elevation view of an extraction tool in accordance with an embodiment of the present invention.

FIG. 3 shows a side view of an extraction tool which represents an embodiment of the present invention. The extraction tool is generally indicated at 100. The extraction tool has a frame 102 which is generally u-shaped. The frame 102 includes a crossbar 104, and first and second legs 106, 108 extending from the crossbar 104. First and second legs 106, 108 are symmetrical with respect to one another.

Extraction tool 100 further includes an upper bar 118 located adjacent to the crossbar 104 and coupled at either end to the cross bar 104 by rods 124 and 126, discussed below in more detail. Upper bar 118 includes a cam lever 120 which is pivotally coupled within an opening in the upper bar 118 by a pin 122. The cam portion 121 of the cam lever 120 cooperates with a bearing 123 which is coupled to the crossbar 104. The bearing 123 acts as the follower of cam portion 121 so that rotation of the cam lever 120 causes upper bar 118 to move upwardly, away from the cross bar 104.

Members shown in the form of rods 124 and 126 extend through the upper bar 118 near the opposite ends of the upper bar. Rods 124, 126 further extend into pre-formed holes extending along the longitudinal axes of the first leg 106 and second leg 108, respectively. The rods fit within the holes in first leg 106 and second leg 108 such that their rotational movement is not impaired. Four press fit retaining rings 128 secure the rods to upper bar 118 without impairing rotation of the rods. The retaining rings 128 may be placed on the rods adjacent to the upper and lower surfaces of the upper bar 118 so as to tightly couple the rods 124, 126 to the upper bar such that vertical movement of the upper bar 118 is transmitted to the rods.

Located near the lower end of each rod are protuberances shown in the form of dowels 132 and 134 which function as the mechanical linkage, or engaging means, between the extraction tool and the object to be extracted. The dowels are coupled to the lower portion of rods 124 and 126, respectively. The dowels 132, 134 may be coupled by a press fit into holes formed in the lower portions of the rods 124, 126. The dowels extend outwardly from the rods and extend through appropriately sized openings 148, 150 in the walls of the legs. The openings through which the dowels pass may be formed such that the dowels can swing through at least approximately 90° of arc in a horizontal plane parallel to the longitudinal axis of the cross bar 104. The arc or range of travel of the dowels 132, 134 may include an engaged position, wherein the two dowels 132, 134 are parallel to each other, extending into an interior area defined by the first and second legs 106, 108 and a resting position, wherein the two dowels are perpendicular to the longitudinal axis of cross bar 104.

Affixed to each rod 124, 126 near the upper end thereof is a knurled thumb screw 130, 131 which provides a convenient mechanism for causing the rods 124, 126 to rotate about their longitudinal axes and thereby swing the dowels 132, 134 through their arc of travel. The each rod 124, 126 passes through a circular opening in the center of the respective knurled thumb screw 130, 131. The knurled thumb screws 130, 131 may be joined to the respective rods 124, 126 by a press fit, gluing or other suitable joining technique.

In one embodiment of the invention as illustrated in FIG. 3, the tool includes set screws 140, 142 and extension springs 136, 138. The set screws extend through threaded apertures in the upper bar 118. The extension springs 136, 138 are connected at their first ends to the upper bar 118 and at their other ends to the top of frame 102. The extension springs couple the upper bar 18 to the frame 102 and may provide a constant force pulling the upper bar 118 toward the cross bar 104.

Figure 4:
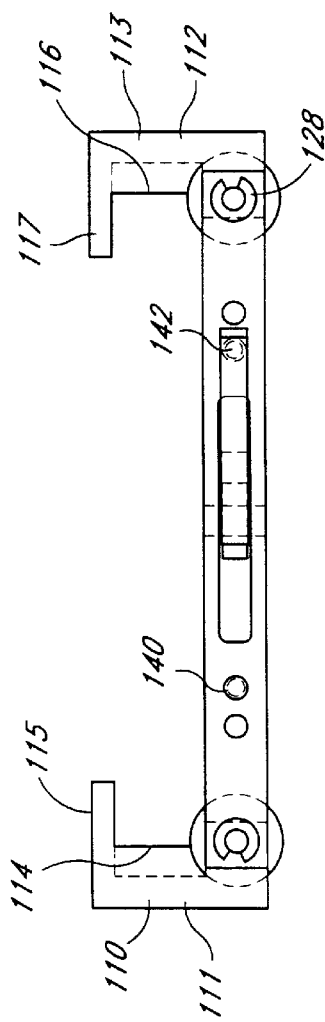
FIG. 4 is a top plan view of the extraction tool shown in FIG. 3.

Referring now to FIG. 4, which is a top plan view of the extraction tool 100 shown in FIG. 3, it can be seen that the first leg 106 includes a first encircling arm 110 extending outwardly therefrom and the second leg 108 includes a second encircling arm 112 extending outwardly therefrom. Each encircling arm includes an upper arm 111, 113. The upper arms 111, 113 extend out from the first and second legs 106, 108, perpendicular to the horizontal axis of the cross bar 104 and parallel to each other. A ramp 114, 116 is located on the inner side (the sides facing each other) of each upper arm. Each encircling arm further includes a forearm 115, 117, which may extend at a right angle to the corresponding upper arm 111, 113.

Figure 1:
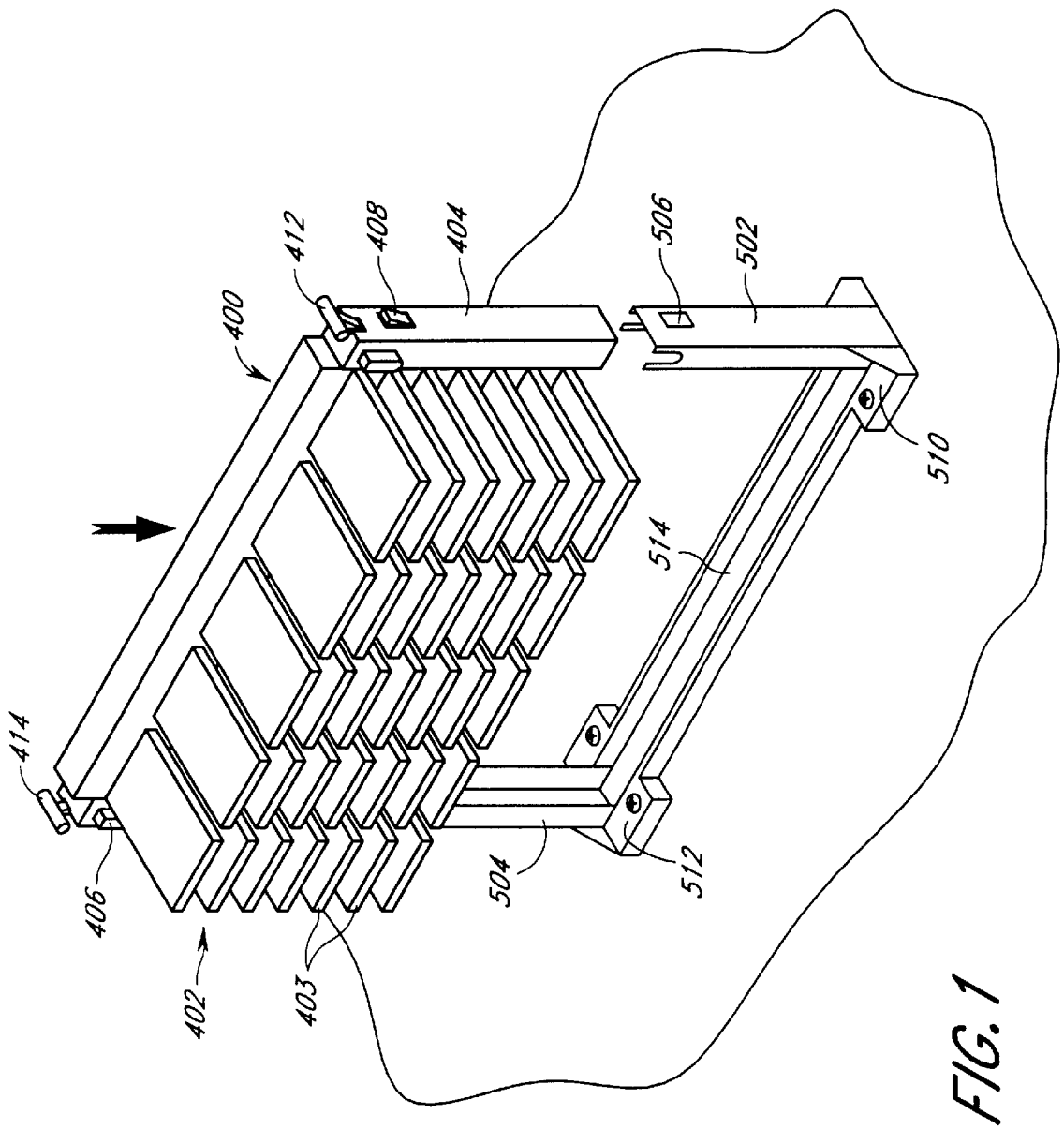
FIG. 1 is a perspective view of an integrated circuit cartridge and a connector.
Figure 2:
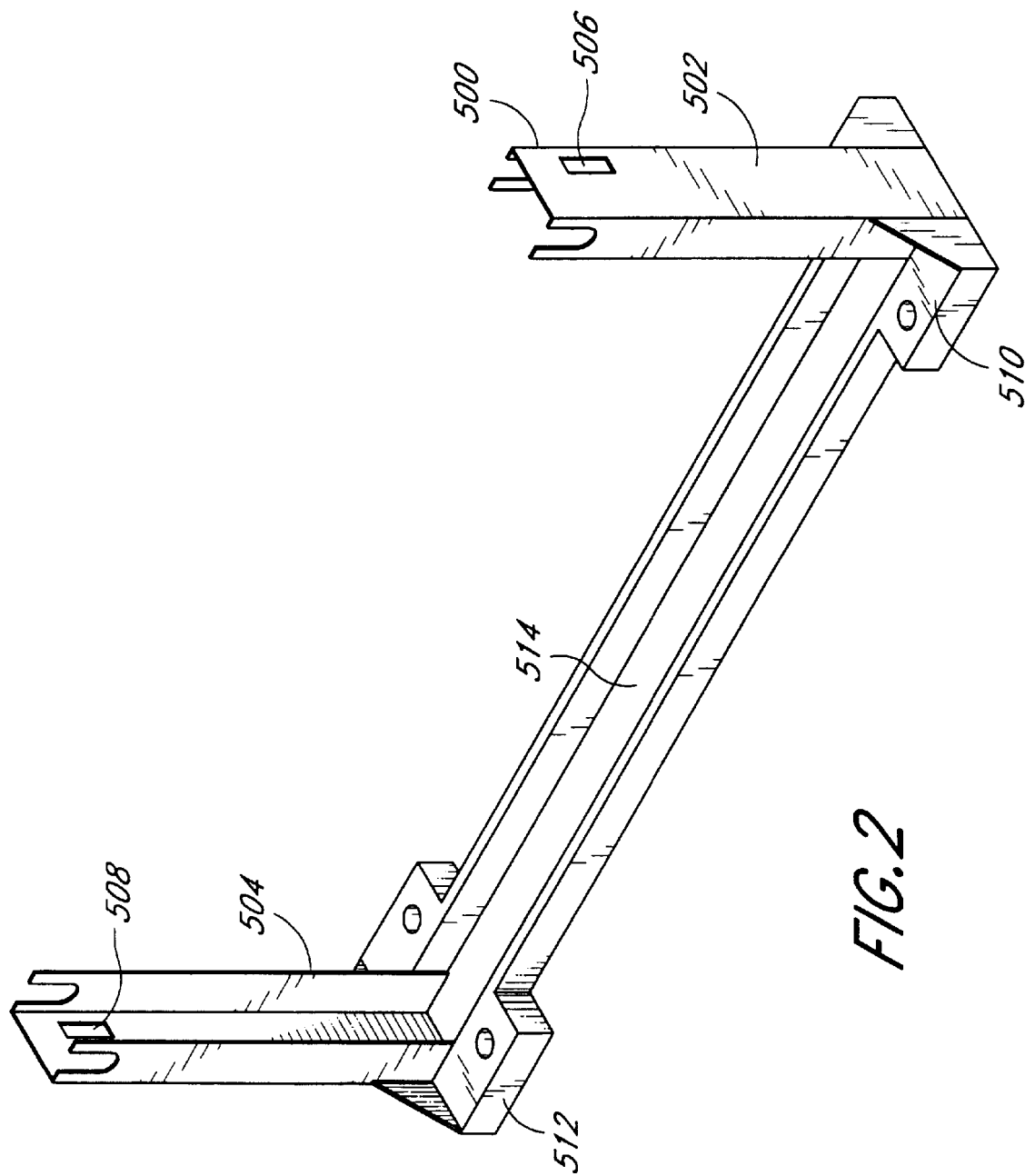
FIG. 2 is a perspective view of a connector for a cartridge.
Figure 5:
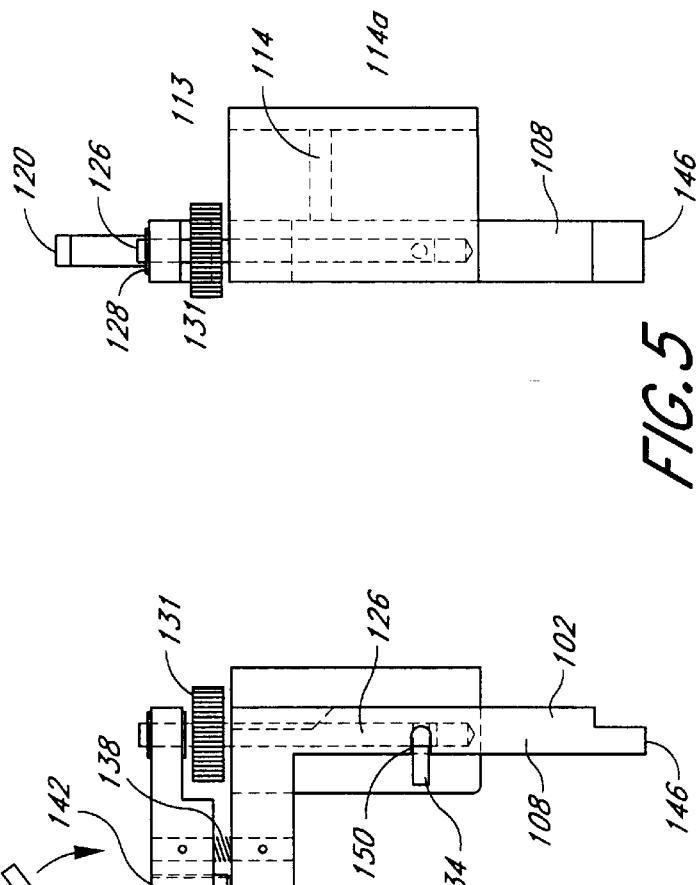
FIG. 5 is a side elevation view of the extraction tool shown in FIG. 3.
Figure 7:
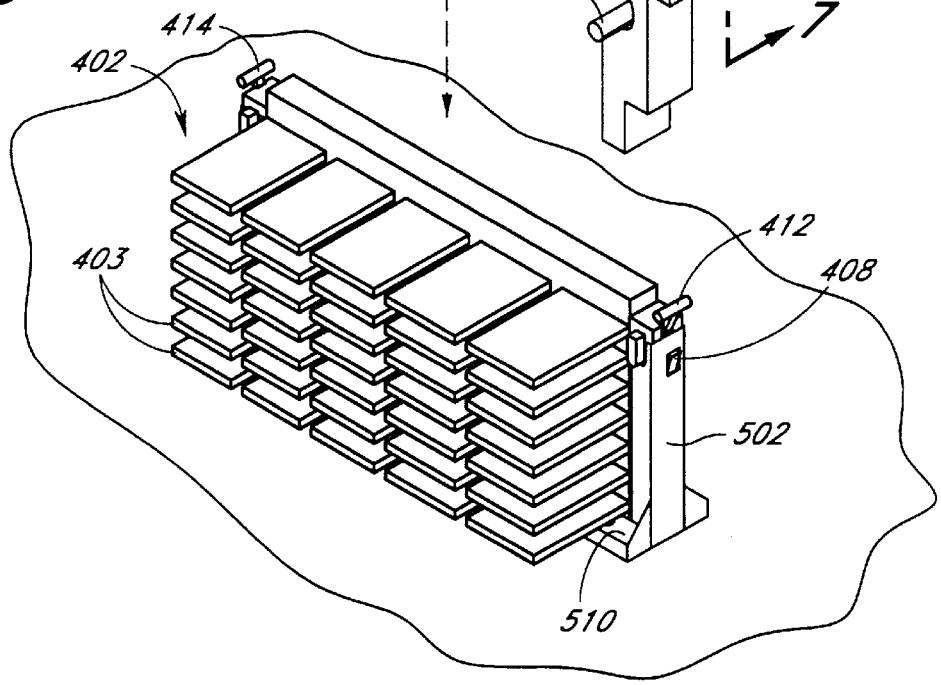
FIG. 7 is a cut-away view taken along line 7—7 of FIG. 6.
Figure 7:
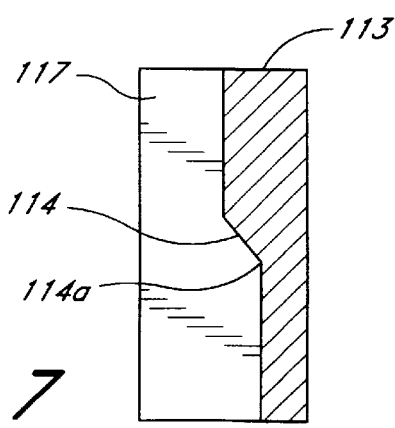

As can be seen in FIG. 5, which is a side elevation view of the extraction tool 100 shown in FIG. 5, the upper arms 111, 113 extend out from approximately the upper two thirds of the first and second legs 106, 108. The ramps 114, 116 are located on the interior sides of the upper arms 111, 113. Ramp 114 is shown in detail in FIG. 7. Note that ramp 116 is similarly constructed. The ramp 114 is wedge shaped in cross section, having its lower end 114a flush with the surface of the interior side of the upper arm 113 and its upper end rising out from the surface of the upper arm to form a sloped surface with respect to the vertical surface of the interior side of the upper arms 113.

Figure 6:
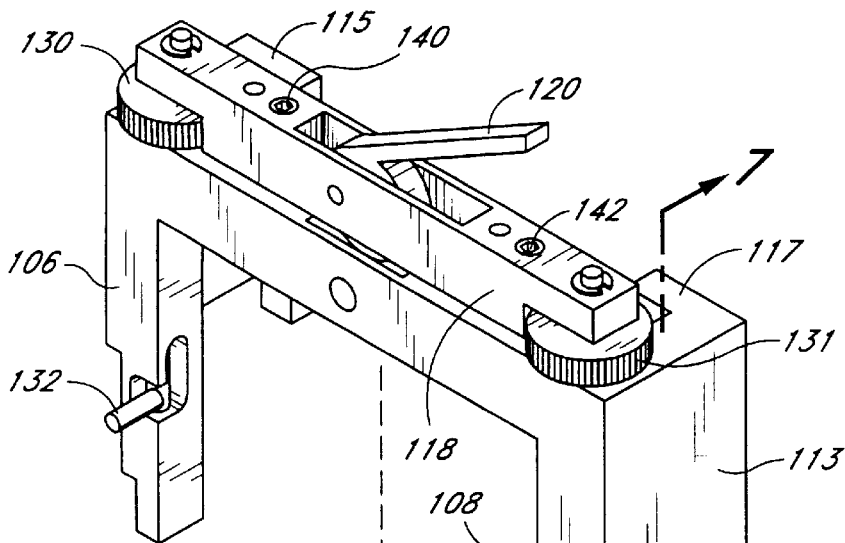
FIG. 6 is a perspective view of the extraction tool shown in FIG. 3 in position to begin extracting an integrated circuit cartridge from a connector.

Operation of the extraction tool will now be discussed in one area of application with reference to FIG. 6. To remove a cartridge 400 from its connector 500, the first and second legs 106, 108 of the extraction tool 100 are aligned with the goal posts 106, 108 such that each of the upper arms 111, 113 are in position to align with the outer sides of the goal posts 502, 504 and the forearms 115, 117 are in position to extend along the side of the cartridge 400 opposite the heat sink. Next, the extraction tool 100 is moved downwardly with the upper arms 111, 113 sliding along the outer sides of the goal posts 108. As the ends 144, 146 of the two legs slide toward the bases 510, 512 of the goal posts, the two ramps 114, 116 engage and activate the two latch levers 412, 414. The activation of the latch levers occurs as the two latch levers slide along the sloped surfaces of the two ramps and are thereby moved inwardly. The inward movement of the two latch levers 412, 414 causes the two latches 406, 408 to retract into their respective rails 404, 406 and thereby disengage from the openings 506, 508 in the two goal posts 502, 504. The two ramps are positioned on the upper arms such that as the ends 144, 146 of the two legs come to rest at the respective bases 510, 512 of the goal posts, the ramps have fully activated the latch levers.

With the two dowels 132, 134 in their resting positions, parallel to each other and perpendicular to the long axis of the cross bar 104, the height of the dowels with respect to the cartridge 400 is adjusted to correspond with one of the openings between the fins 403 of the heat sink 402 by operation of the two set screws 140, 142. Rotating the set screws clockwise causes them to extend further out from the upper bar 118 toward the crossbar 104, forcing the upper bar away from the cross bar 104 and thereby raising the dowels 132, 134 with respect to the ends 144, 146 of the legs. Alternatively, rotating the set screws counter-clockwise causes them to retract into the upper bar 118 away from the cross bar, allowing the upper bar to move toward the cross bar 104 (under tension from extension springs 136, 138) and thereby lowering the dowels 132, 134 (and the rods 106, 108) with respect to the ends 144, 146 of the legs. The selected openings between the fins 403 act as lifting points for the removal of the cartridge. Any appropriately placed notch or indentation on the cartridge can serve the same purpose, which is to provide a lifting contact surface.

After the dowels are aligned with the selected openings between fins of the heat sink, each of the dowels is rotated approximately 90°, by use of the respective thumb screws 130, 131 to lie between two fins 403 of the heat sink. Moving cam lever 120 in a downward direction causes cam portion 121 to rotate eccentrically about pin 122 while sliding on its outer surface along bearing 123. The eccentric rotation of cam portion 121 while in contact with bearing 123 forces upper bar 118 to move upwardly, away from crossbar 104. The movement of upper bar 118 pulls rods 106, 108 upward, away from the ends 144, 146 of the legs. As that movement occurs, the dowels first engage, or come into contact with, the upper one of the fins between which each dowel has been positioned. Continued downward movement of the cam lever 120 causes the dowels to exert a lifting pressure on the cartridge via the heat sink, thereby pulling the cartridge upward away from the socket 514. Once the cartridge is disconnected from the socket, the thumb screws are turned to rotate the dowels out of contact with the fins of the heat sink and into their resting position. The extraction tool can then be removed. The cartridge can then be easily removed by hand by sliding it up, along the goal posts.

The rods and the pre-formed holes in the legs may be configured such that during removal of a cartridge, the rods and pre-formed holes cooperate to keep the extraction force applied to the cartridge in the desired direction, parallel to the long axes of the goal posts. This aides in minimizing the possibility of damage to the cartridge and the connector.

The invention may be embodied in other specific forms and arrangements without departing from its spirit or essential characteristics. For example, various lifting means may be used to provide the force which causes the rods and dowels to move relative to the frame 102. In one embodiment, the above described cam lever 120 is replaced with a simple lever or a screw type arrangement The locations of the cam lever 120 and the bearing 123 can be reversed if allowance is made for the cam lever to pass through the upper bar. The set screws can be replaced with other height adjustment mechanism or done without altogether. The upper bar can be replaced with an alternative mechanical linkage between the two rods such as forming the two rods as a single, generally u-shaped piece. The rods and dowels can be replaced with other appropriate mechanisms known to those of skill in the art for temporarily connecting the portion of the tool which exerts the lifting force to the cartridge so that the lifting force is applied to the cartridge. For example, L shaped members could be used that pivot about their attachment point to the upper bar such that they could be swung into engagement with the fins of the heat sink. In addition, as is apparent to those of ordinary skill in the art, many of the pieces of the extracting tool can be formed of separate elements which are then assembled, such as the cross bar 104 and the first and second legs 106, 108 or, those elements may be manufactured as a single piece.

The invention has been shown and described with respect to particular embodiments. However, it will be understood by those skilled in the art that various changes may be made therein without departing from the spirit and scope of the invention. The scope of the invention is indicated by the appended claims rather than by the foregoing description. All changes which come within the meaning and range of equivalency of the claims are to be embraced within their scope.

What is claimed is:

1. An extraction tool comprising:
    a generally u-shaped frame including first and second legs extending therefrom;
    a cross bar extending between said first and second legs;
    first and second encircling arms extending out from said crossbar said first and second encircling arms formed so as to provide support for a device being extracted;
    an upper bar adjacent to said frame;
    a cam lever having a cam portion and rotatably coupled to said upper bar and operatively in contact with said frame, said cam lever having a first position and a second position wherein moving said cam lever from said first position to said second position causes said upper bar to move away from said frame, said frame further including a bearing on an upper surface of said frame, located so as to be in contact with said cam portion of said cam lever; and
    first and second rods rotatably coupled to said upper bar and extending through said frame, each rod having a dowel extending out from a lower portion thereof for engaging a device to be extracted.

2. An extraction tool as set forth in claim 1, further comprising:
    an extension spring coupling said crossbar to said upper bar.

3. An extraction tool as set forth in claim 1, further comprising:
    a set screw extending through said upper bar toward said crossbar.

4. An integrated circuit cartridge extraction tool useful in removing a component from a connector, the extraction tool comprising:
    a u-shaped frame having a central crossbar;
    first and second encircling arms extending out from said crossbar, said first and second encircling arms formed so as to at least partially encircle a cartridge to be extracted;
    a first member passing through said cross bar, said first member having a protuberance extending out from a lower portion of said first member;
    a second member passing through said cross bar, said, said second member having a protuberance extending out from a lower portion of said second member;
    an upper bar adjacent said crossbar, said first and second members rotatably coupled to said upper bar; and
    a cam lever operatively coupled to said upper bar and contacting said frame.

5. An extraction tool as set forth in claim 4, further comprising:
    an extension spring coupling said crossbar to said upper bar.

6. An extraction tool as set forth in claim 5, further comprising:
    a set screw extending through said upper bar toward said crossbar.

7. An extraction tool as set forth in claim 4, further comprising:
    a first release ramp located on an inner side of said first encircling arm; and
    a second release ramp located on an inner side of said second encircling arm.

8. An integrated circuit extraction tool useful in removing an integrated circuit device from a connector having a base with a socket and first and second guides extending from the base on opposite sides of the socket wherein the integrated circuit device slides between the guides into the socket with the integrated circuit device including latches with release levers on both sides with the latches being capable of engaging with openings in the guides to lock the integrated circuit into an inserted position, the extraction tool comprising:

a frame including a crossbar and first and second legs extending from the crossbar;

an upper bar adjacent said crossbar;

a lifting means operatively in contact with said upper bar and said cross bar, for moving said upper bar away from said crossbar;

a first rod rotatably coupled to said upper bar and extending into said first leg, said first rod having a dowel extending out from a lower portion thereof through an opening in said first leg, for engaging a device to be extracted;

a second rod rotatable coupled to said upper bar and extending into said second leg, said second rod having a dowel extending out from a lower portion thereof through an opening in said second leg, for engaging a device to be extracted; and first and second encircling arms extending out from said crossbar, said first and second encircling arms and formed so as to receive the guides therebetween, said encircling arms each including a ramp for engaging the release levers of the cartridge.

9. An integrated circuit extraction tool as set forth in claim 8, wherein said lifting means includes a cam lever pivotally coupled to said upper bar.

* * * * *